United States Patent
Lee et al.

(10) Patent No.: US 7,443,728 B2
(45) Date of Patent: Oct. 28, 2008

(54) NAND FLASH MEMORY DEVICE AND METHOD OF PROGRAMMING SAME

(75) Inventors: Jin-Wook Lee, Seoul (KR); Pyung-Moon Zhang, Yongin-si (KR)

(73) Assignee: Samsung Electronic Co., Ltd., Suwon-si, Gyeonggi-do (KR)

(*) Notice: Subject to any disclaimer, the term of this patent is extended or adjusted under 35 U.S.C. 154(b) by 205 days.

(21) Appl. No.: 11/242,013

(22) Filed: Oct. 4, 2005

(65) Prior Publication Data
US 2006/0146609 A1  Jul. 6, 2006

(30) Foreign Application Priority Data
Dec. 31, 2004  (KR) .................. 10-2004-0117618

(51) Int. Cl.
G11C 16/24 (2006.01)
G11C 16/10 (2006.01)
G11C 16/06 (2006.01)
G11C 7/02 (2006.01)
G11C 8/12 (2006.01)
G11C 7/12 (2006.01)

(52) U.S. Cl. ..................... 365/185.17; 365/185.02; 365/185.25; 365/185.11; 365/185.08

(58) Field of Classification Search ............ 365/185.02, 365/185.08, 185.12, 185.17, 185.25, 206, 365/239, 185.11, 230.03, 230.04, 203, 204, 365/189.02, 189.05
See application file for complete search history.

(56) References Cited

U.S. PATENT DOCUMENTS

| | | | | |
|---|---|---|---|---|
| 5,422,856 | A | * | 6/1995 | Sasaki et al. ......... 365/230.03 |
| 5,430,674 | A | * | 7/1995 | Javanifard ............. 365/185.1 |
| 5,625,590 | A | * | 4/1997 | Choi et al. ............ 365/185.17 |
| 6,134,145 | A | * | 10/2000 | Wong .................... 365/185.22 |
| 6,160,750 | A | * | 12/2000 | Shieh .................... 365/230.03 |
| 6,480,419 | B2 | * | 11/2002 | Lee ....................... 365/185.18 |
| 6,522,580 | B2 | * | 2/2003 | Chen et al. ............ 365/185.02 |
| 6,751,124 | B2 | | 6/2004 | Lee |
| 6,768,682 | B2 | * | 7/2004 | Yano et al. ............ 365/185.28 |
| 6,806,525 | B2 | * | 10/2004 | Takeuchi et al. ............ 257/296 |
| 2002/0114188 | A1 | | 8/2002 | Lee |
| 2004/0027881 | A1 | * | 2/2004 | Furukawa ................ 365/200 |
| 2004/0264275 | A1 | * | 12/2004 | Gou ......................... 365/203 |

FOREIGN PATENT DOCUMENTS

| | | |
|---|---|---|
| JP | 2002-251896 | 9/2002 |
| JP | 2002-288987 | 10/2002 |
| KR | 100206696 B1 | 4/1999 |
| KR | 100255955 B1 | 2/2000 |
| KR | 1020010081243 A | 8/2001 |
| KR | 1020020069092 | 8/2002 |
| KR | 1020030088595 | 11/2003 |

* cited by examiner

*Primary Examiner*—J. H. Hur
(74) *Attorney, Agent, or Firm*—Volentine & Whitt, PLLC

(57) ABSTRACT

Disclosed is a NAND flash memory device comprising a memory cell array connected to a page buffer via a plurality of bitlines. The page buffer stores input data to be programmed in the memory cell array. The memory cell array is programmed by establishing bitline voltages for the plurality of bitlines according to the input data and then applying a wordline voltage to the memory cell array. The bitline voltages are established by first precharging the bitlines to a power supply voltage and then selectively discharging the bitlines according to the input data. The bitlines are discharged sequentially, i.e., some of the bitlines are discharged before others.

18 Claims, 5 Drawing Sheets

NAND FLASH MEMORY DEVICE AND METHOD OF PROGRAMMING SAME

BACKGROUND OF THE INVENTION

1. Field of the Invention

The present invention relates generally to a memory device. More particularly, the invention relates to a NAND flash memory device and a method of programming the same.

A claim of priority is made to Korean Patent Application No. 2004-117618 filed Dec. 31, 2004, the disclosure of which is hereby incorporated by reference in its entirety.

2. Description of the Related Art

A NAND flash memory device comprises a plurality of memory cells arranged in a matrix. The matrix is divided into a plurality of memory blocks and each of the plurality of memory blocks is divided into a plurality of pages. The NAND flash memory device performs erase operations a block at a time and it performs read and program operations a page at a time.

FIG. 1 is a diagram of a conventional NAND flash memory device disclosed in Korean Patent Application No. 2001-56526.

Referring to FIG. 1, a NAND flash memory device 100 comprises a memory cell array 110, a row decoder circuit 120, a switch circuit 130, a control circuit 140, a page buffer 150, and a column pass gate 160.

Memory cell array 110 comprises first strings 112e connected to a plurality of first bitlines BLe0 through BLeN and second strings 112o connected to a plurality of second bitlines BLo0 through BLoN. The first and second strings are formed in an alternating arrangement known as a shielded bitline architecture. The purpose of the shielded bitline architecture is to reduce coupling capacitance between the first and second bitlines.

Each string comprises first and second select transistors ST and GT and a plurality of cell transistors M0 through MM. First and second select transistors ST and GT and cell transistors M0 through MM are connected in series.

Gates of first and second select transistors ST and GT are respectively connected to string and ground select lines SSL and GSL. Gates of cell transistors M0 through MM are respectively connected to corresponding wordlines WL0 through WLm. Lines SSL, GSL, and WL0 through WLm are connected to row decoder circuit 120. A source of second select transistor GT is electrically connected to a common source line CSL.

Row decoder circuit 120 selects a memory block and a wordline in response to a predetermined input address and supplies a wordline voltage to the selected wordline as a program voltage. Row decoder circuit 120 selects the memory block by activating (i.e., setting to a logic level "high") a block select line BLKWL. While block select line BLKWL is activated, the wordline voltage is applied to the selected wordline.

NAND flash memory device 100 further comprises a PMOS transistor P4 and an NMOS transistor N4. PMOS transistor P4 pre-charges a node VIRPWR to a power supply voltage Vcc in response to a control signal VIRPWRP. NMOS transistor N4 discharges node VIRPWR to ground in response to a control signal VIRPWRN.

NAND flash memory device 100 comprises third bitlines connecting nodes X1 to page buffer 150. Nodes X1 are connected pairs of first and second bitlines as illustrated in FIG. 1. First NMOS transistors Ne1 selectively connect first bitlines BLe0 to BLeN to corresponding nodes X1 in response to a control signal BLSHFe.

Second NMOS transistors No1 selectively connect second bitlines BLo0 through BLoN to corresponding nodes X1 in response to a control signal BLSHFo. Third NMOS transistors N2 selectively connect the third bitlines to page buffer 150 in response to a control signal BLSLT. Control circuit 140 generates control signals BLSHFe, BLSHFo, and BLSLT using a timing scheme illustrated in FIG. 2.

Page buffer 150 comprises latches 151 storing data to be programmed in memory cell array 110. Latches 151 are connected to the third bitlines. Column pass gate 160 provides predetermined input data to page buffer 150.

FIG. 2 is a waveform timing diagram illustrating a program operation of the NAND flash memory device in FIG. 1. The program operation of FIG. 2 is performed using a two-stage bitline setup technique described below. In the two-stage bitline setup technique, bitline voltages are established, or "set up" by first precharging the bitlines to a power source voltage Vcc and then selectively discharging some of the bitlines according to the input data stored in page buffer 150. In other words, the term "bitline setup" is used to denote a process of establishing bitline voltages used in a program operation of the semiconductor device. Once the bitline voltages are "set up", a wordline voltage is applied to the wordline to program the NAND flash memory device.

Referring to FIG. 2, first and second bitlines BLe0 through BLeN and BLo0 through BLoN are pre-charged during a first bitline setup interval SETUP1. In interval SETUP1, control signals VBLe and VBLo are set to power supply voltage Vcc. As a result, first and second bitlines BLe0 through BLeN and BLo0 through BLoN are driven to power supply voltage Vcc. Control signal BLSLT is maintained at a logic level "low" during interval SETUP1. NMOS transistors N2 are turned off by the control signal BLSLT, so that the third bitlines are disconnected from page buffer 150.

In a second bitline setup interval SETUP2, third control signal BLSLT has a reference voltage VREF lower than power supply voltage Vcc, and control signal BLSHFe is at logic level "high". NMOS transistors Ne1 are all turned on by control signal BLSHFe to connect latches 151 in page buffer 150 to respective first bitlines BLe0 through BLeN. First bitlines are selectively discharged according to data stored in latches 151. For example, where one of latches 151 stores a logical '0', a corresponding one of first bitlines BLe0 through BLeN is discharged. In contrast, where one of latches 151 stores a logical '1', a corresponding one of first bitlines BLe0 through BLeN is maintained at power supply voltage Vcc.

Following interval SETUP2, a program voltage is supplied to a selected wordline during a program interval. After the program interval, first and second bitlines BLe0 through BLeN and BLo0 through BLoN are all discharged.

Third NMOS transistors N2 are simultaneously turned on during bitline setup interval SETUP2 and first or second NMOS transistors Ne1 or No1 are turned on during interval SETUP1. Because third NMOS transistors N2 are turned on at the same time, bitlines corresponding to transistors N2 are simultaneously discharged according to data stored in latches 151. In other words, bitlines are simultaneously discharged by corresponding latches 151 storing data '0'.

Where bitlines are simultaneously discharged, a voltage at string select line SSL drops due to a coupling capacitance between the bitlines and string select line SSL. As the voltage at string select line SSL drops, a voltage at block select line BLKWL is also lowered due to a coupling capacitance between string select line SSL and block select line BLKWL. Lowering the voltage at block select line BLKWL prevents block select transistors controlled by block select line BLKWL from being turned on. Where the block select transistors controlled by block select line BLKWL are not turned on, the program voltage fails to drive the selected wordline.

The failure of the program voltage to drive the selected wordline can lead to program failures, e.g., un-programmed memory cells. In order to overcome program failures, multiple program loops are often performed on the selected memory cell using an increasing program voltage. Typically, the program voltage is increased in a stepwise fashion for each additional program loop. Unfortunately, the increase in the program voltage can cause some unexpected or undesired results. For example, where the coupling capacitance is low because only a few memory cells are discharged, some of the memory cells may be over-programmed by the increased program voltage.

In order to avoid problems caused by the coupling capacitance, a NAND flash memory device with a reduced coupling capacitance is needed.

SUMMARY OF THE INVENTION

According to one embodiment of the invention, A NAND flash memory device is provided. The NAND flash memory device comprises a memory cell array connected to a plurality of bitlines. A page buffer storing input data to be programmed in the memory cell array is connected to the memory cell array via the plurality of bitlines. A bitline setup circuit sequentially discharging the bitlines according to the input data is connected to the bitlines.

The bitline setup circuit typically comprises a switch circuit connecting and disconnecting the bitlines to and from the page buffer and a control circuit controlling the switch circuit to connect and disconnect the bitlines to and from the page buffer.

Sequentially discharging the bitlines according to the input data typically comprises first discharging at least one of the bitlines and then discharging at least one more of the bitlines. Typically, a bitlines is only discharged if it is connected to a latch in the page buffer storing a logical '0'. Otherwise, the bitline is generally maintained at a power supply voltage.

According to another embodiment of the invention, another NAND flash memory device is provided. The NAND flash memory device comprises a memory cell array, a plurality of first and second bitlines formed in an alternating arrangement and connected to the memory cell array, a plurality of third bitlines connected to first and second bitlines at connection points between the first and second bitlines, a page buffer storing input data to be programmed in the memory cell array and connected to the third bitlines, and a bitline setup circuit sequentially discharging the first, second, and third bitlines based on the input data.

According to still another embodiment of the present invention, a method of programming a NAND flash memory device is provided. The method comprises storing input data in a page buffer connected to a memory cell array through a plurality of bitlines, sequentially setting up bitline voltages used in a program operation, and, upon sequentially setting up the bitline voltages, applying a program voltage to a selected wordline of the memory cell array.

DESCRIPTION OF THE EXEMPLARY EMBODIMENTS

Figure 1:
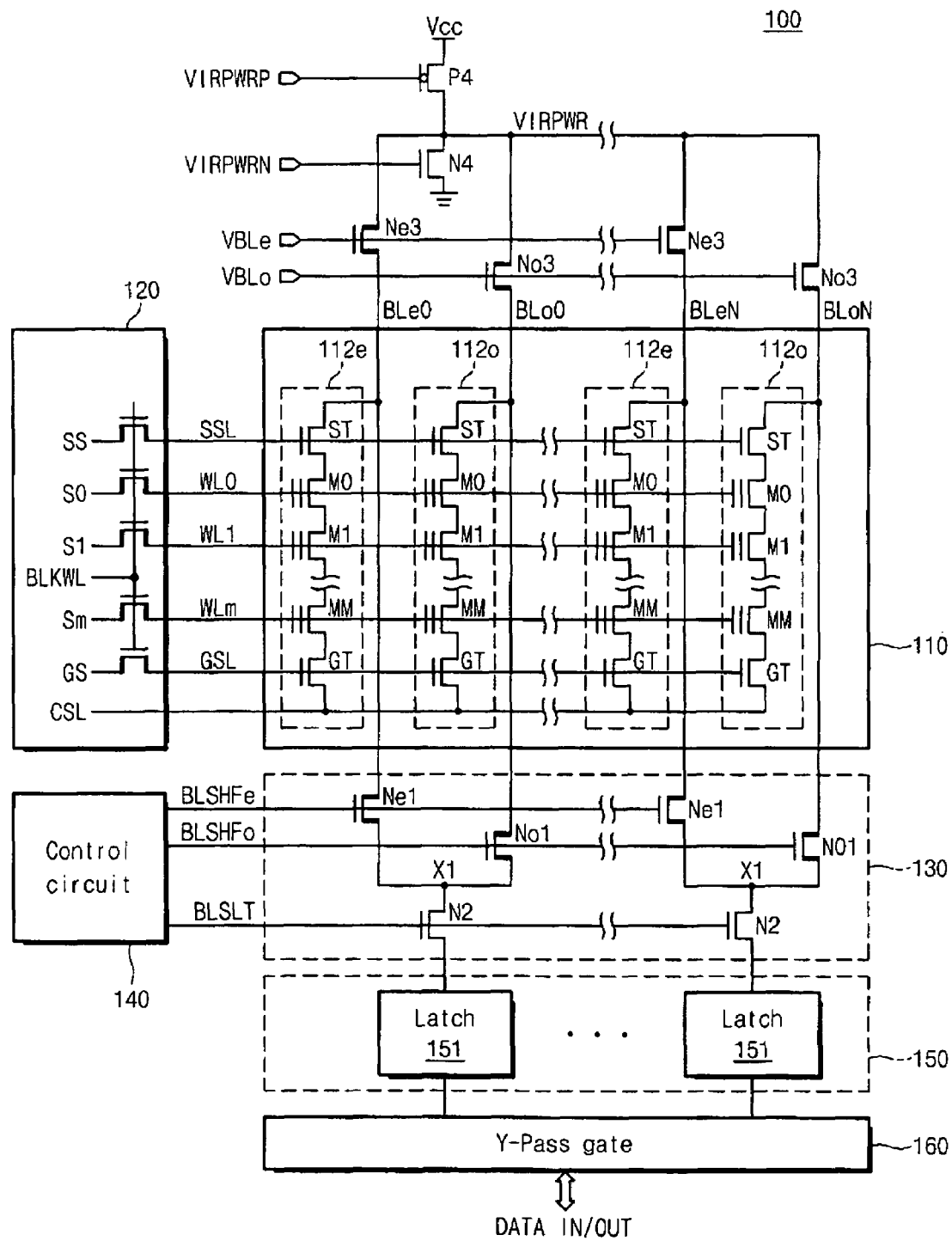
FIG. 1 is a diagram of a conventional NAND flash memory device.
Figure 2:
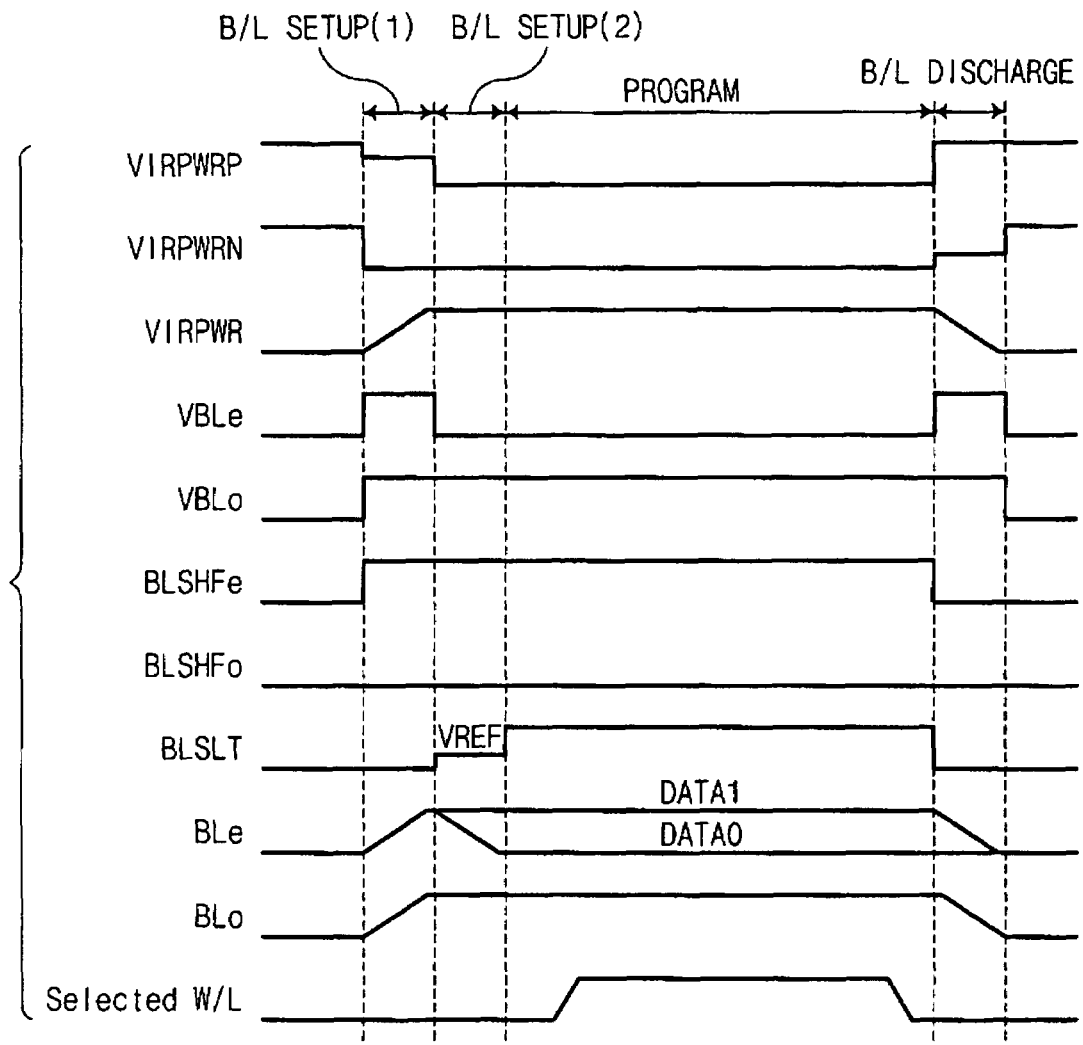
FIG. 2 is a waveform timing diagram illustrating a program operation of the conventional NAND flash memory device.
Figure 3:
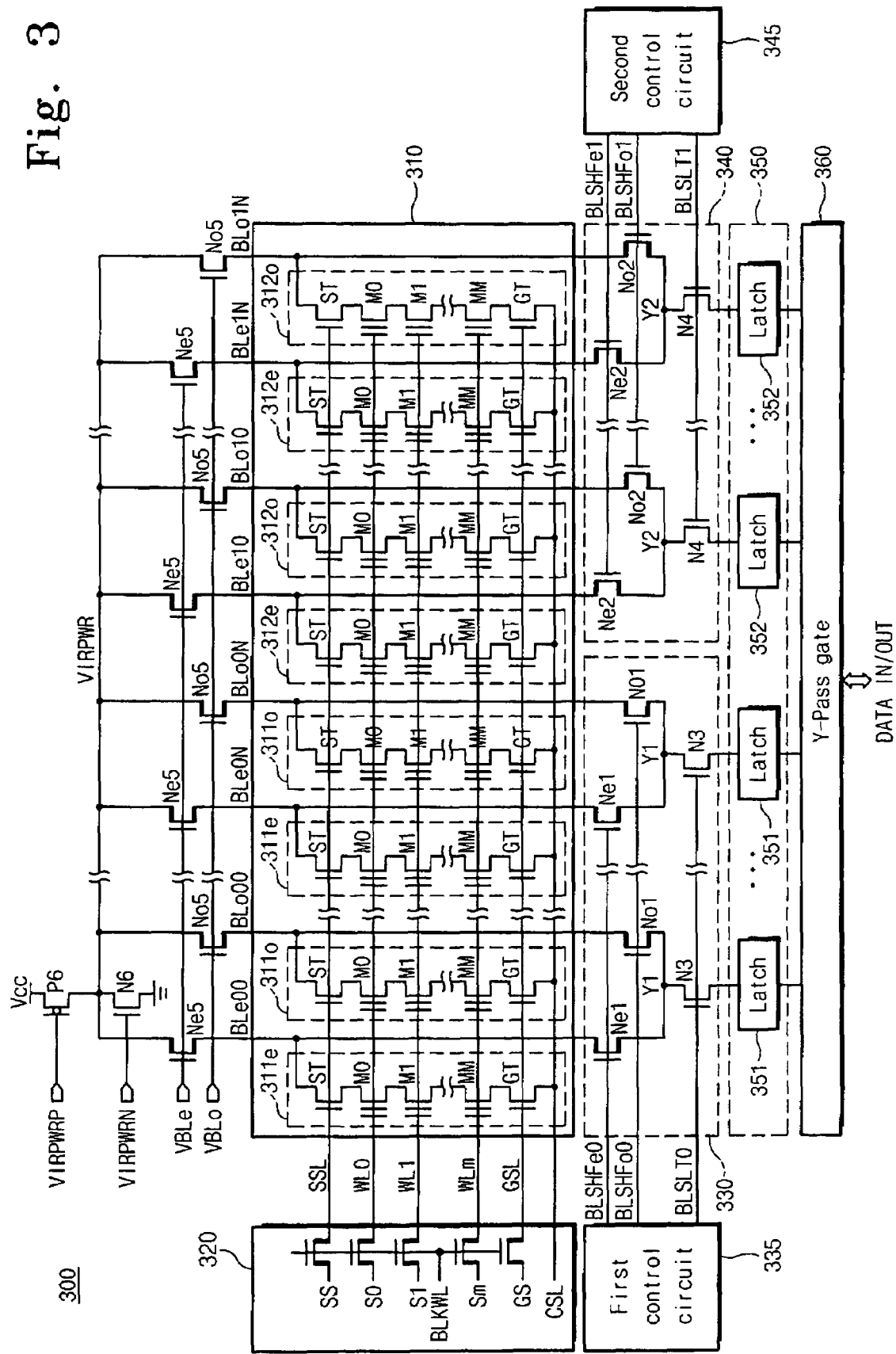
FIG. 3 is a block diagram of a NAND flash memory device according to one embodiment of the present invention.

FIG. 3 is a block diagram of a NAND flash memory device according to one embodiment of the present invention.

Referring to FIG. 3, a NAND flash memory device 300 comprises a memory cell array 310, a row decoder circuit 320, first and second switch circuits 330 and 340, first and second control circuits 335 and 345, a page buffer 350, and a column pass gate 360.

Memory cell array 310 comprises a plurality of first strings 311e connected to a plurality of first bitlines BLe00 through BLe0N, a plurality of second strings 311o connected to a plurality of second bitlines BLo00 through BLo0N, a plurality of third strings 312e connected to a plurality of third bitlines BLe10 through BLe1N, and a plurality of fourth strings 312o connected to a plurality of fourth bitlines BLo10 through BLo1N.

Each of the first through fourth strings 311e, 311o, 312e, and 312o comprises first and second select transistors ST and GT and a plurality of cell transistors M0 through MM. In each string, transistors ST, M0 to MM and GT are connected in series. Gates of first and second select transistors ST and GT are connected to respective string and ground select lines SSL and GSL. Gates of cell transistors M0 through MM are respectively connected to corresponding wordlines WL0 to WLm. Lines SSL, GSL, and WL0 through WLm are connected to row decoder circuit 320. A source of second select transistor GT is electrically connected to a common source line CSL.

First bitlines BLe00 through BLe0N are formed in an alternating arrangement with second bitlines BLo00 through BLo0N and third bitlines BLe10 through BLe1N are formed in an alternating arrangement with fourth bitlines BLo10 through BLo1N. The alternating bitline arrangement is known as a shielded bitline architecture and is intended to reduce coupling capacitance between the bitlines.

Row decoder circuit 320 selects a memory block and a corresponding wordline in response to a predetermined input address. Row decoder circuit 320 supplies a wordline voltage to the selected wordline as a program voltage. A block select line BLKWL is selected by activating block select line BLKWL. A program voltage is supplied to the selected wordline when block select line BLKWL is activated.

First switch circuit 330 is connected to first and second bitlines BLe00 through BLe0N and BLo00 through BLo0N. Second switch circuit 340 is connected to third and fourth bitlines BLe10 through BLe1N and BLo10 through BLo1N.

First switch circuit 330 comprises first and second NMOS transistors NE1 and No1. Each of first and second NMOS transistors typically has a threshold voltage higher than a power supply voltage Vcc. First NMOS transistors NE1 are turned on by a first control signal BLSHFe0 generated by first control circuit 335, and second NMOS transistors No1 are turned on by a second control signal BLSHFo0 generated by first control circuit 335. First switch circuit 330 further comprises fifth bitlines connecting nodes Y1 and latches 351. Each node Y1 is formed at a connection between pairs of first and second bitlines BLe00 through BLe0N and BLo00 through BLo0N. NMOS transistors N3 are formed on the fifth bitlines between nodes Y1 and latches 351. NMOS transistors N3 are turned on in response to a fifth control signal BLSLT0 from first control circuit 335.

Second switch circuit 340 comprises third and fourth NMOS transistors Ne2 and No2. Each of third and fourth NMOS transistors Ne2 and No2 typically has a threshold voltage higher than power supply voltage Vcc. Third NMOS transistors Ne2 are turned on by a third control signal BLSHFe1 generated by second control circuit 345, and fourth NMOS transistors No2 are turned on by a fourth control signal BLSHFo1 generated by second control circuit 345. Second switch circuit 340 further comprises sixth bitlines connecting nodes Y2 and latches 352. Each node Y2 is formed at a connection between pairs of third and fourth bitlines BLe10 through BLe1N and BLo10 through BLo1N. NMOS transistors N4 are formed on the sixth bitlines between nodes Y2 and latches 352. NMOS transistors N4 are turned on in response to a sixth control signal BLSLT1 from second control circuit 345.

First control circuit 335 generates control signals BLSHFe0, BLSHFo0, and BLSLT0, and second control circuit 345 is generates control signals BLSHFe1, BLSHFo1, and BLSLT1. Timing relationships between the control signals generated by first and second control circuits 335 and 345 are described below in relation to FIG. 4.

First switch circuit 330, first control circuit 335, second switch circuit 340, and second control circuit 345 constitute a bitline setup circuit setting up bitlines for a program operation of flash memory device 300.

Flash memory device 300 further comprises a PMOS transistor P6 and an NMOS transistor N6. PMOS transistor P6 pre-charges a node VIRPWR to a power supply voltage Vcc in response to a control signal VIRPWRP, and NMOS transistor N6 discharges VIRPWR node to ground in response to a control signal VIRPWRN.

NMOS transistors Ne5 are connected between node VIRPWR and first and third bitlines BLe00 to BLe0N and BLe10 to BLe1N. NMOS transistors Ne5 are controlled by a control signal VBLe. Each of NMOS transistors Ne5 typically has a threshold voltage higher than power supply voltage Vcc.

NMOS transistors No5 are connected between node VIRPWR and second and fourth bitlines BLo00 through BLo0N and BLo10 through BLo1N. NMOS transistors No5 are controlled by a control signal VBLo. Each of NMOS transistors No5 typically has a threshold voltage higher than power supply voltage Vcc. Timing relationships between control signals VBLe, VBLo, VIRPWRP and VIRPWRN are described below in relation to FIG. 4.

Page buffer 350 comprises latches 351 and 352 storing data to be programmed in memory cell array 310. First latches 351 are connected to the fifth bitlines, i.e., nodes Y1, via respective NMOS transistors N3. Second latches 352 are connected to the sixth bitlines, i.e., nodes Y2, via corresponding NMOS transistors N4. Column gate 360 selectively transfers externally provided data to page buffer 350.

Figure 4:
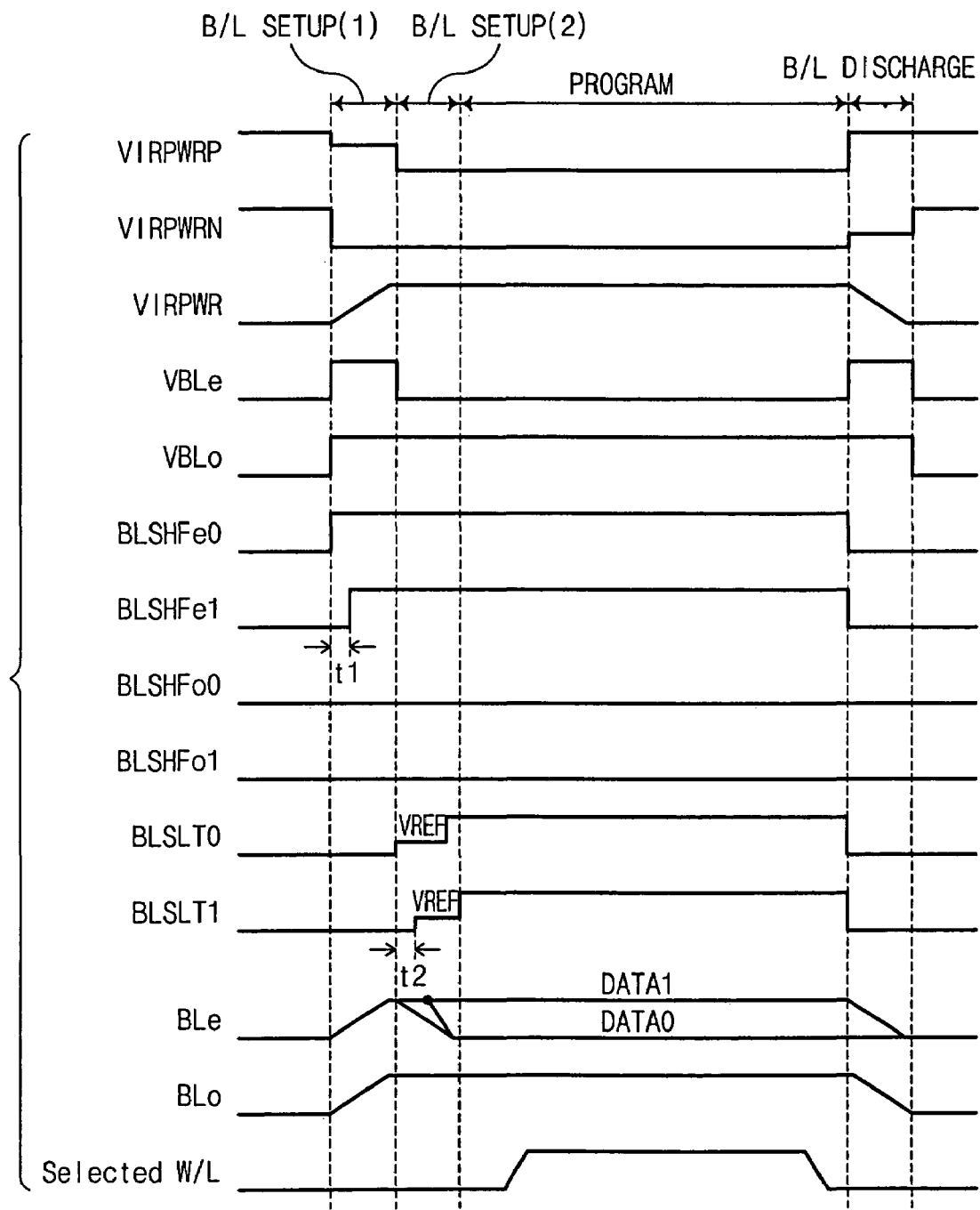
FIG. 4 is a waveform timing diagram illustrating a program operation of a NAND flash memory device according an embodiment of the present invention; and, FIG. 5 is a block diagram of a NAND flash memory device according to another embodiment of the present invention.

FIG. 4 is a waveform timing diagram illustrating a program operation of a NAND flash memory device according to an embodiment of the present invention. The program operation is described below with reference to FIGS. 3 and 4.

Referring to FIG. 4, the program operation uses a two-stage bitline setup technique wherein data to be programmed in memory cell array 310 is stored in latches 351 and 352 of page buffer 350.

During a first bitline setup interval B/L SETUP(1), first through fourth bitlines BLe00 through LBe0N, BLo00 through BLo0N, BLe10 through BLe1N, and BLo10 through BLo1N are pre-charged to power supply voltage Vcc. In interval B/L SETUP(1), PMOS transistor P6 is turned on in response to control signal VIRPWRP. Once PMOS transistor P6 is turned on, a voltage level of node VIRPWR increases toward power supply voltage Vcc.

NMOS transistors Ne5 and No5 are turned on in response to an activation of control signals VBLe and VBLo. This enables the first through fourth bitlines to be pre-charged to power supply voltage Vcc. Control signals BLSLT0 and BLSLT1 remain at logic level "low" during interval B/L SETUP(1), causing NMOS transistors N3 and N4 of first and second switch circuits 330 and 340 to be turned off. As a result, the fifth and sixth bitlines are isolated from page buffer 350 during interval B/L SETUP(1).

Control signals BLSHFo0 and BLSHFo1 remain at logic level "low" during interval B/L SETUP(1). As a result, the second and fourth bitlines are electrically isolated from nodes Y1 and Y2 during interval B/L SETUP(1). Control signal BLSHFe0 is activated at the beginning of interval B/L SETUP(1) and control signal BLSHFe1 is activated after a time t1 following the activation of control signal BLSHFe0. Accordingly, first NMOS transistors Ne1 and third NMOS transistors Ne2 are turned on sequentially.

In a second bitline setup interval B/L SETUP(2), first bitlines BLe00 through BLe0N and third bitlines BLe10 through BLe1N are sequentially discharged according to data stored in page buffer 350. First bitlines BLe00 through BLe0N are discharged at the beginning of interval B/L SETUP(2) and third bitlines BLe10 through BLe1N are discharged after a time t2 following the discharge of first bitlines BLe00 through BLe0N.

During interval B/L SETUP(2), control signals BLSLT0 and BLSLT1 are set to a reference voltage VREF, which is lower than power supply voltage Vcc. Control signal BLSLT0 is set to reference voltage VREF at the beginning of interval B/L SETUP(2) and control signal BLSLT1 is set to reference voltage VREF after time t2 following the beginning of interval B/L SETUP(2).

NMOS transistors N3 and N4 are sequentially turned on in response to control signals BLSLT0 and BLSLT1. It is possible to limit a current flowing through transistors N3 and N4 by supplying a reference voltage VREF, which is lower than the power supply voltage Vcc, to transistors N3 and N4. Limiting of a current via transistors N3 and N4 prevents a current peak from occurring at latches 351 and 352.

During interval SETUP(2), control signals BLSHFe0 and BLSHFe1 stay at logic level "high". While control signals BLSHFe0 and BLSHFe1 are at logic level "high", transistors Ne1 and Ne2 are turned on, enabling first bitlines BLe00 through BLe0N to be discharged according to data stored in latches 351. After time t2 elapses, third bitlines BLe10 to BLe1N are discharged according to data stored in latches 352. A particular bitline is only discharged where data stored in a corresponding latch is a logical '0'.

After interval SETUP(2), a program voltage is applied to the selected wordline during a program interval. Once the program interval elapses, the first through sixth bitlines are all discharged.

In the NAND flash memory device described above, bitline voltages used to program the flash memory device are established or "set up" based on data stored in the page buffer. First bitlines BLe00 through BLe0N are set up according to data stored in latches 351, and then third bitlines BLe10 through BLe1N are set up according to data stored in latches 352.

In other words, first and third bitlines BLe00 through BLe0N and BLe10 through BLe1N are set up sequentially rather than simultaneously. This reduces bitline coupling capacitance introduced in the bitline setup interval of the program operation. This, in turn, reduces coupling capacitance between string select line SSL and block select line BLKWL.

For convenience of description, bitlines in memory cell array 310 are divided into two groups. However, the bitlines can be divided into more than two groups. By dividing bitlines in memory cell array 310 into "N" groups, bitline coupling capacitance is reduced by a factor of 1/"N". As the bitline coupling capacitance is reduced and a corresponding coupling capacitance between string select line SSL and block select line BLKWL is also reduced, a voltage drop in a program voltage applied the selected wordline is avoided.

Figure 5:
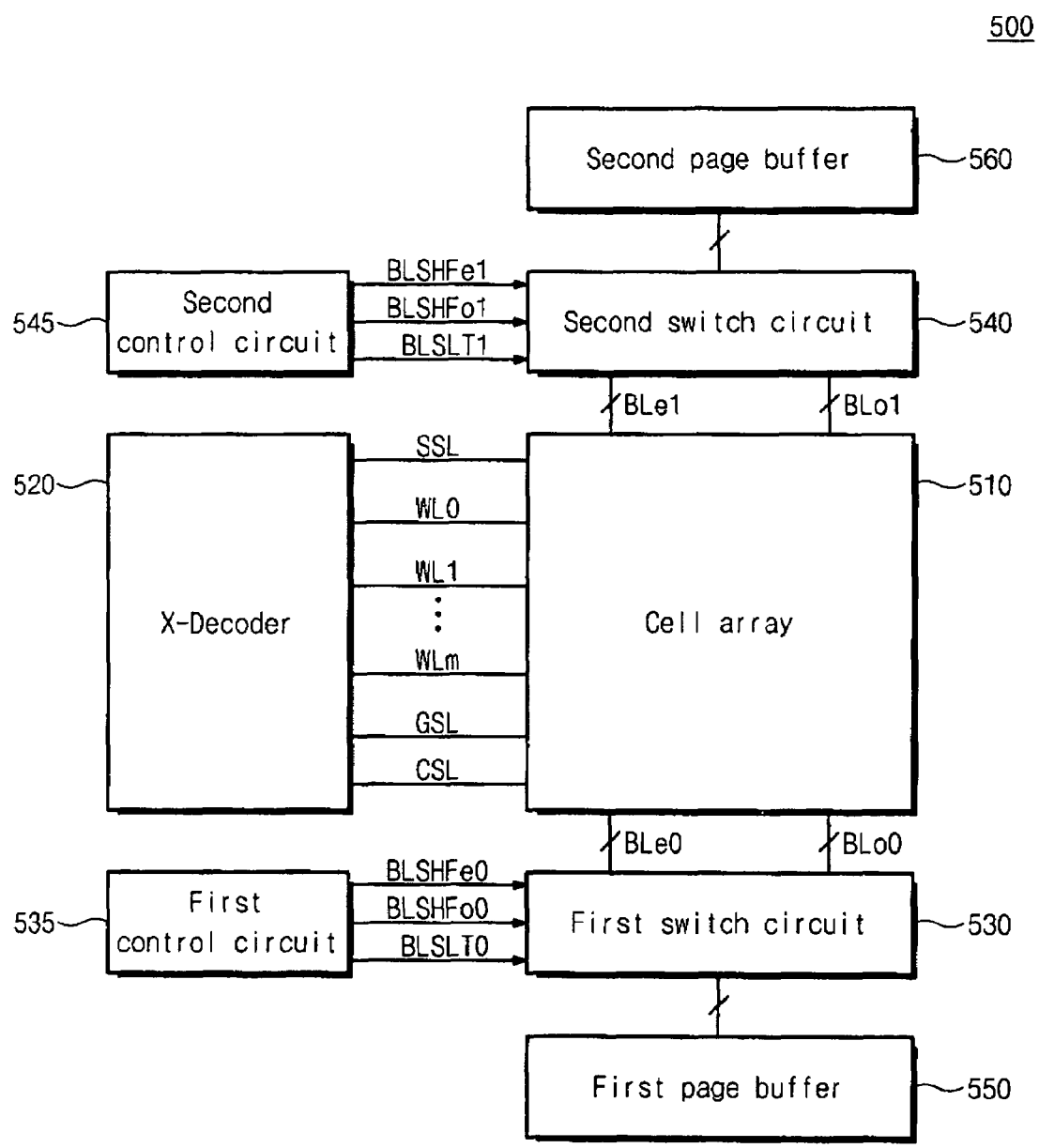

FIG. 5 is a block diagram of a NAND flash memory device according to another embodiment of the present invention.

Referring to FIG. 5, NAND flash memory device 500 comprises a first page buffer 550 and a second page buffer 560 arranged symmetrically about a memory cell array 510. This arrangement is called a TOP/DOWN page buffer arrangement.

In the TOP/DOWN page buffer arrangement, a first switch circuit 530 controlled by a first control circuit 535 is formed between memory cell array 510 and first page buffer 550. A second switch circuit 540 controlled by a second control circuit 545 is formed between memory cell array 510 and second page buffer 560. In addition, a row decoder circuit 520 is formed adjacent to memory cell array 510.

The NAND flash memory device of FIG. 5 is substantially the same as that of FIG. 3, except that the device of FIG. 3 only has one page buffer compared with the two page buffers in the device of FIG. 5. As a result, further description of the NAND flash memory device of FIG. 5 is omitted to avoid redundancy.

In a NAND flash memory device having a conventional TOP/DOWN page buffer arrangement, control signals BLSHFe0, BLSHFe1, BLSHFo0, BLSHFo1, BLSLT0, and BLSLT1 output by first and second control circuits 535 and 545 are activated simultaneously. As a result, bitlines in the memory device are simultaneously discharged. This typically causes coupling capacitance, which may lead to program failures. However, the flash memory device shown in FIG. 5 is configured so that respective control signals BLSHFe0 and BLSHFFe1, BLSHFo0 and BLSHFo1, and BLSLT0 and BLSLT1 are activated sequentially. As a result, coupling capacitance is reduced, thereby reducing the number of program failures.

The foregoing preferred embodiments are teaching examples. Those of ordinary skill in the art will understand that various changes in form and details may be made to the exemplary embodiments without departing from the scope of the present invention which is defined by the following claims.

What is claimed:

1. A NAND flash memory device, comprising:
   a memory cell array connected to a plurality of bitlines, wherein the plurality of bitlines is divided into N groups of bitlines, where "N" is an integer greater than 2;
   a page buffer storing input data to be programmed in the memory cell array and connected to the memory cell array via the plurality of bitlines; and,
   a bitline setup circuit connected to the bitlines and sequentially discharging the N groups of bitlines according to the input data during a single programming operation, wherein the bitline setup circuit comprises:
   N switch circuits respectively connecting/disconnecting the N groups of bitlines to/from the page buffer; and a control circuit controlling operation of the N switch circuits to sequentially discharge the N groups of bitlines through the page buffer.

2. The NAND flash memory device of claim 1, wherein the switch circuit comprises switches respectively formed on each one of the plurality of bitlines.

3. The NAND flash memory device of claim 2, wherein at least one of the switches comprises a negative metal oxide semiconductor (NMOS) transistor.

4. The NAND flash memory device of claim 1, wherein the page buffer comprises:
   a first page buffer and a second page buffer formed on opposite sides of the cell array; and,
   wherein the bitline setup circuit comprises:
   a first bitline setup circuit setting up first bitlines within the N groups of bitlines connected between the memory cell array and the first page buffer; and,
   a second bitline setup circuit setting up second bitlines within the N groups of bitlines connected between the memory cell array and the second page buffer.

5. The NAND flash memory device of claim 4, wherein the control circuit is configured to discharge the first bitlines after the second bitlines.

6. The NAND flash memory device of claim 1, wherein the page buffer comprises:
   a plurality of latches storing the input data and connected to the plurality of bitlines.

7. A NAND flash memory device, comprising:
   a memory cell array comprising a plurality of bitlines divided into an alternating arrangement of even and odd bitlines, wherein the even bitlines are further divided into first, second, and third bitline groups;
   a page buffer storing input data to be programmed in the memory cell array and connected to the plurality of bitlines via a bitline setup circuit, wherein the bitline setup circuit comprises first, second, and third switch circuits connecting the first, second, and third bitline groups, respectively, to the page buffer; and
   a control circuit using the first through third switch circuits to sequentially discharge the first through third bitline groups, respectively, in accordance with the input data during a single programming operation.

8. The NAND flash memory device of claim 7, wherein the page buffer comprises a plurality of latch circuits respectively associated with bitlines of the first through third bitline groups and adapted to store input data to be programmed in the memory cell array.

9. The NAND flash circuit of claim 8, wherein the first switch circuit comprises:
   a first transistor switching a bitline of the first bitline group;
   a second transistor switching a first odd bitline the odd bitlines, wherein the outputs of the first and second transistors are connected to a first common output node;
   a first common node transistor connecting the first common output node and a first latch circuit of the plurality of latch circuits;
   another first transistor switching another bitline of the first bitline group;
   another second transistor switching a second odd bitline of the odd bitlines, wherein the outputs of the another first and second transistors are connected to a second common output node; and
   a second common node transistor connecting the second common output node and a second latch circuit of the plurality of latch circuits.

10. The NAND flash memory device of claim 9, wherein the control circuit comprises first and second control circuits configured to respectively control the operation of the first and second switch circuits.

11. The NAND flash memory device of claim 10, wherein the first control circuit generates a first control signal commonly applied to the gates of the first transistor and the another first transistor, a second control signal commonly applied to the gates of the second transistor and the another second transistor, and a third control signal applied to the gates of the first and second common node transistors.

12. The NAND flash circuit of claim 11, wherein the second switch circuit comprises:
- a third transistor switching a bitline of the second bitline group;
- a fourth transistor switching a third odd bitline of the odd bitlines, wherein the outputs of the third and fourth transistors are connected to a third common output node;
- a third common node transistor connecting the third common output node and a third latch circuit of the plurality of latch circuits;
- another third transistor switching another bitline of the second bitline group;
- another fourth transistor switching a fourth odd bitline of the odd bitlines, wherein the outputs of the another third and fourth transistors are connected to a fourth common output node; and
- a fourth common node transistor connecting the fourth common output node and a fourth latch circuit of the plurality of latch circuits.

13. The NAND flash memory device of claim 12, wherein the second control circuit generates a fourth control signal commonly applied to the gates of the third transistor and the another third transistor, a fifth control signal commonly applied to the gates of the fourth transistor and the another fourth transistor, and a sixth control signal applied to the gates of the third and fourth common node transistors.

14. The NAND flash memory device of claim 13, wherein application of the first through sixth control signals to the bitline setup circuit sequentially discharges the first and second bitline groups in accordance with the input data.

15. A method of programming a NAND flash memory device, the method comprising:
- storing input data in a page buffer connected to a memory cell array through a plurality of bitlines, wherein the plurality of bitlines is divided into an alternating arrangement of even and odd bitlines, and wherein the even bitlines are further divided into first, second, and third bitline groups;
- during a single program operation, sequentially setting up bitline voltages for the first through third bitline groups; and thereafter,
- applying a program voltage to a selected wordline of the memory cell array.

16. The method of claim 15, wherein sequentially setting up the bitline voltages for the first through third bitline groups comprises:
- pre-charging the plurality of bitlines to a power source voltage; and thereafter,
- sequentially discharging the first through third bitline groups based on the input data.

17. The method of claim 16, wherein sequentially discharging the first through third bitline groups based on the input data comprises:
- discharging bitlines within the first through third bitline groups that are connected to latches storing a logical '0' in the page buffer.

18. The method of claim 16, wherein sequentially discharging the first through third bitline groups based on the input data comprises:
- maintaining bitlines within the first through third bitline groups that are connected to latches storing a logical '1' in the page buffer at the power source voltage.

* * * * *